United States Patent [19]

Jarwala et al.

[11] Patent Number: 4,833,677
[45] Date of Patent: May 23, 1989

[54] EASILY TESTABLE HIGH SPEED ARCHITECTURE FOR LARGE RAMS

[75] Inventors: Najmi T. Jarwala; Dhiraj K. Pradhan, both of Amherst, Mass.

[73] Assignee: The United States of America as represented by the Secretary of the Air Force, Washington, D.C.

[21] Appl. No.: 60,882

[22] Filed: Jun. 12, 1987

[51] Int. Cl.$^4$ ............................................. G01R 31/28
[52] U.S. Cl. ............................................. 371/21; 365/201
[58] Field of Search ................. 365/200, 201; 371/20, 371/21; 340/825.02

[56] References Cited

U.S. PATENT DOCUMENTS 3,351,905  11/1967  Kramer ................................. 371/21
4,347,498   8/1982  Lee et al. ....................... 340/825.02

OTHER PUBLICATIONS

Horowitz, E. et al., "The Binary Tree as an Interconnection Network...", IEEE Trans on Computers, vol. C-30, No. 4, Apr. 1981, pp. 247-253.
Bardell, Jr., P. et al., "Self-Test of Random Access Memories", 1985 International Test Conference, Paper 10.1, pp. 352-355.

*Primary Examiner*—Charles E. Atkinson
*Assistant Examiner*—Stephen M. Baker
*Attorney, Agent, or Firm*—William Stepanishen; Donald J. Singer

[57] ABSTRACT

The RAM is partitioned into modules, each of which appear as the leaf node of a binary interconnect network. This network carries the address/data/control bus which permits the nodes to communicate between themselves and with the outside world. The address, data and control signals are applied to the root node. The most significant address bit is decoded, generating either a left subtree or a right subtree select. The other signals would be buffered and propogated down the tree. The solution process occurs at each level within the bus until finally a single leaf node would be selected. Within the node, then, the internal timing and control unit would access the data requested, sending it up the tree or writing the value on the data bus, into the addressed location.

6 Claims, 3 Drawing Sheets

EASILY TESTABLE HIGH SPEED ARCHITECTURE FOR LARGE RAMS

STATEMENT OF GOVERMENT INTEREST

The invention described herein may be manufactured and used by or for the Government for governmental purposes without the payment of any royalty thereon.

BACKGROUND OF THE INVENTION

The invention relates broadly to a test apparatus for random access memory (RAM) devices, and in particular to a fault tolerant test apparatus for large capacity random access memory units.

Accurate and economical fault testing of random access memory devices is a problem that has been addressed with great intensity by the computer industry. Fault tolerant testing of large random access memories is also the subject of intensive research both in the industry and in universities. The present test apparatus is the first of its kind that provides a unified solution to problems that have been tackled individually. One of the prior art techniques of defect tolerance during RAM testing has been implemented by integrating redundant rows and columns and using laser programming or other techniques to switch out faulty cells. References (2), (3), (6), (8) are some examples of the publications that propose this technique. Another technique proposed is the use of on Chip Error Correcting Codes. References (7) and (9) are examples of this approach. Design for testability has been proposed in references (10) and (1). The first modifies the sense amplifiers of the dynamic RAM to form a circular shift register of the RAM array. An on chip test pattern generator initializes this array which is then circulated and this action executes a test algorithm. The second basically implements the algorithm in references (4), (5) on chip.

REFERENCES

[1] Bardell P. H., McAnney W. H., "Self-Test of Random Access Memories", Proceedings, International Test Conference, Philadelphia, pp 352–355, Nov. 1985.

[2] Cenker R. P., Clemons D. G., Huber W. R., Petrizzi J. B., Procyk F. J., Trout G. M., "A Fault Tolerant 64K Dynamic Random Access Memory" IEEE Trans. on Electron Devices, Vol. ED-26, No. 6, June 1979, pp 853–860

[3] Haraszti T. P. "A Novel Associative Approach for Fault-Tolerant MOS RAM's.", IEEE Journal of Solid-State Circuits, Vol. SC-17, No. 3, June 1982, pp 539–546.

[4] Knaizuk J., Hartmann C. R. P., "An Algorithm for Testing RAMs" IEEE Trans. on Computers, Vol. C-26, No. 4, April 1977, pp 414–416.

[5] Knaizuk J., Hartmann C. R. P., "An Optimal Algorithm for Testing stuck-at faults in RAMs" IEEE Trans. on Computers, Vol. C-26, No. 11, April 1977, pp 1141–1144.

[6] Mano T., Wada M., Ieda N., Tanimoto M., "A Redundancy Circuit for a Fault Tolerant 256K MOS RAM" IEEE Journal of Solid-State Circuits, Vol. SC-17, No. 4, Aug. 1982, pp 726–730

[7] Mano T., Yamada J., Nakajima S., "Circuit Techniques for a VLSI Memory" IEEE Journal of Solid-State Circuits, Vol. SC-18, No. 5, Oct. 1983, pp 463–469

[8] Smith R. T., Chlipala J., Nelson R. G., Fischer F. H., Mantz T. F., "Laser Programmable Redundancy and Yield Improvement in a 64K DRAM", IEEE Journal of Solid-State Circuits, Vol. SC-16, No. 5, Oct. 1981, pp 506–513.

[9] Tanner R. M. "Fault-Tolerant 256K memory Designs.", IEEE Transactions on Computers, Vol. C-33, No. 4, April 1984, pp 314–322.

[10] You Y., Hayes J. P., "A Self-Testing Dynamic RAM Chip" IEEE Journal of Solid-State Circuits, Vol. SC-20, No. 1, Feb. 1985, pp 428–435.

[11] Harowitz E. and Zorat A., "The Binary Tree as an Interconnection Network: Applications to Multiprocessor Systems and VLSI,", IEEE Trans. on Computers, Vol. C-30, No. 4, April 1981.

The state of the art of large scale random access memory test apparatus is well represented and alleviated to some degree by the prior art apparatus and approaches which are contained in the following U.S. Patents:

U.S. Pat. No. 3,810,301 issued to Cook on May 14, 1974;

U.S. Pat. No. 4,066,880 issued to Salley on Jan. 3, 1978; and

U.S. Pat. No. 4,476,546 issued to Varshney on Oct. 9, 1984.

The Cook patent describes a method for making an integrated circuit which consists of subdividing an entire substrate into many independent circuit arrays. In the Cook apparatus programming tests are performed sequentially not in parallel.

The Salley patent teaches a RAM having memory chips arranged in a matrix. The system has means for identifying faulty RAM chips for removal.

The Varshney patent teaches a programmable address buffer arranged in a one tier tree arrangement.

The present invention is radically different in that the size of the RAM that needs to be tested is reduced and these smaller RAMs may be tested in parallel. It should be noted that none of the above papers (or any other published to the best of the inventors' knowledge) propose an architecture that is easily partitionable. That is, the architecture can be divided into parts in which the good working parts can be used and the faulty parts can be disabled. The present testing apparatus will greatly improve yield and will ultimately result in lower costs. All of the prior art approaches that have been proposed, do not have the capability to provide improved performance together with the other advantages that are discussed above.

SUMMARY OF THE INVENTION

The present invention utilizes random access memories that have been partitioned into smaller modules as a means of testing the random access memory (RAM) devices in parallel. The testable device is constructed so that it is partitionable into parts in which working parts can be used and defective parts can be disabled. The RAM array is divided into modules each of which appears as a leaf in a binary tree. Decoders are provided at each level. A root decoder forms the core area of the RAM and is not permitted to fail. The testable device has two modes of operation, a normal mode and a test mode. In the test mode the bus structure is first tested. If it is found to be fault free then there is no interaction between nodes. Testing of each of the nodes individually is equivalent to testing the RAM as a whole. Means are provided to test all nodes in parallel in that all of the lowest level decoders are enabled, allowing the processor to address all nodes simultaneously. A disagreement in comparison at any level activates a fail signal. The RAM can then be taken out of the test mode.

It is one object of the present invention, therefore, to provide an improved fault tolerant large RAM test apparatus.

It is another object of the invention to provide an improved fault tolerant large RAM test apparatus which is easily testable and partially self testing with practical testing times for multimegabit RAMs.

It is still another object of the invention to provide an improved fault tolerant large RAM test apparatus which is partitionable and thereby provides a greater probability of generating partially good products that results in yield improvement.

It is yet another object of the invention to provide an improved fault tolerant large RAM test apparatus wherein the additional area required for large RAMs is typically 8-20 percent.

It is still another object of the invention to provide an improved fault tolerant large RAM test apparatus wherein a reduction in access time of about 30 percent can be expected.

It is yet another object of the invention to provide an improved fault tolerant large RAM test apparatus in which refreshing the nodes in parallel will substantially reduce the amount of time the RAM is not available.

It is still a further object of the invention to provide an improved fault tolerant large RAM test apparatus which would provide increased reliability since failure of a chip in operation would typically cause a single node to fail and the remaining tree could continue to operate, thus providing graceful degradation.

These and other advantages, objects and features of the invention will become more apparent after considering the following description taken in conjunction with the illustrative embodiment in the accompanying drawings.

DESCRIPTION OF THE INVENTION

Figure 1:
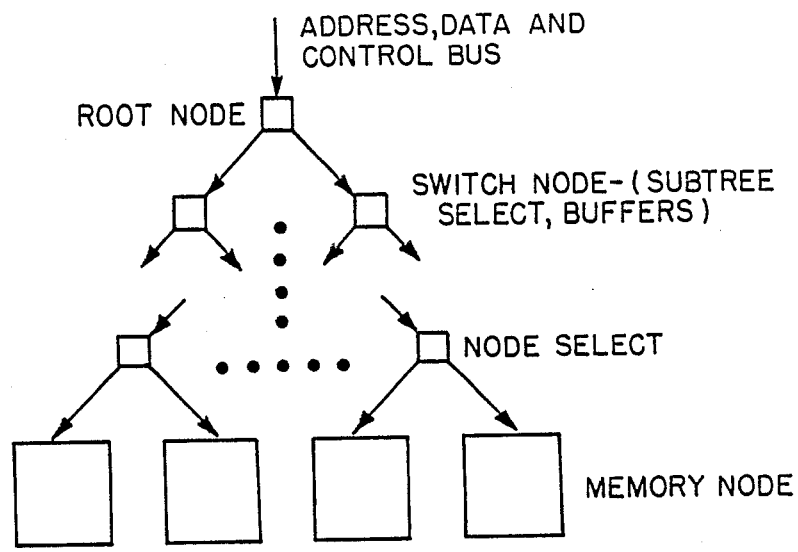
FIG. 1 is a block diagram of the basic elements of the fault tolerant test apparatus.
Figure 2:
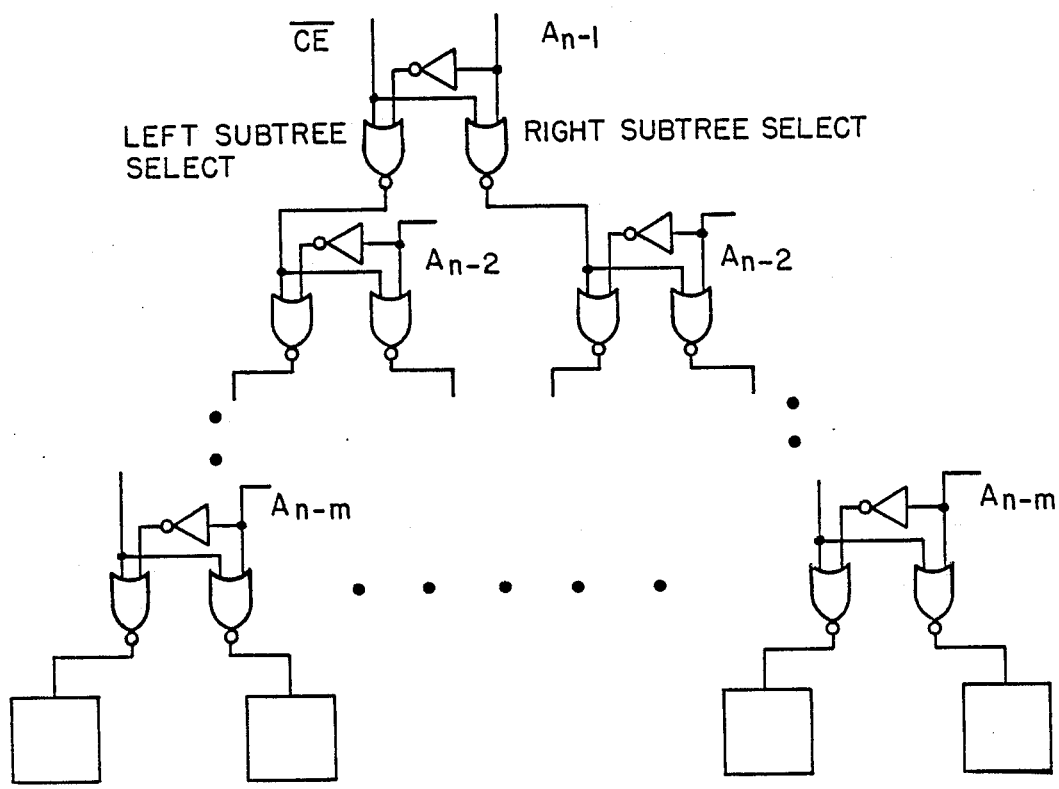
FIG. 2 is a schematic diagram of the tree decoder unit.

Referring now to FIG. 1 there is shown a block diagram of the RAM test apparatus. The RAM array is divided into modules, each of which appears as a leaf node in a binary tree. Theoretically, this can be a tree of any radix; binary trees, however, can be easily mapped onto a plane and they form efficient communication structures. The tree decoders at each level are simple one line to two line decoders which are shown in FIG. 2. The root decoder forms the core area of the RAM test apparatus and cannot fail. The leaf nodes can have a traditional organization with independent control units.

The RAM of size $N=2^n$ is divided into modules, each of which appears as a leaf node in a binary tree (FIG. 1). The depth of the tree, the number of modules or nodes and their size are related by $$N=2^n=2^m \cdot r^{l-1}$$

where N is the size of the RAM in bits, n is the number of address lines (assuming a $N \times 1$ bit organization), r is the radix of the tree (in our design $r=2$), l is the depth of the tree, $r^{l-1}=Q$ represents the number of nodes, and $2^m=M$ which defines the size of each node. In other words, m is the number of address bits per node and therefore $M=2^m$ is the number of bits per node. Note that the root node is at level 1. The inter-related parameters, m and l, define the properties of this architecture. A large l means a higher granularity, a higher degree of fault tolerance, reduced testing time and increased chip size.

Let each cell be identified by the address: $A_{i,j}$, where $0 \leq i \leq (N/Q)-1$ (address within node) and $0 \leq j \leq Q-1$ (node address). Let each node be indentified by $(B)_j$, where $0 \leq j \leq Q-1$.

Figure 3:
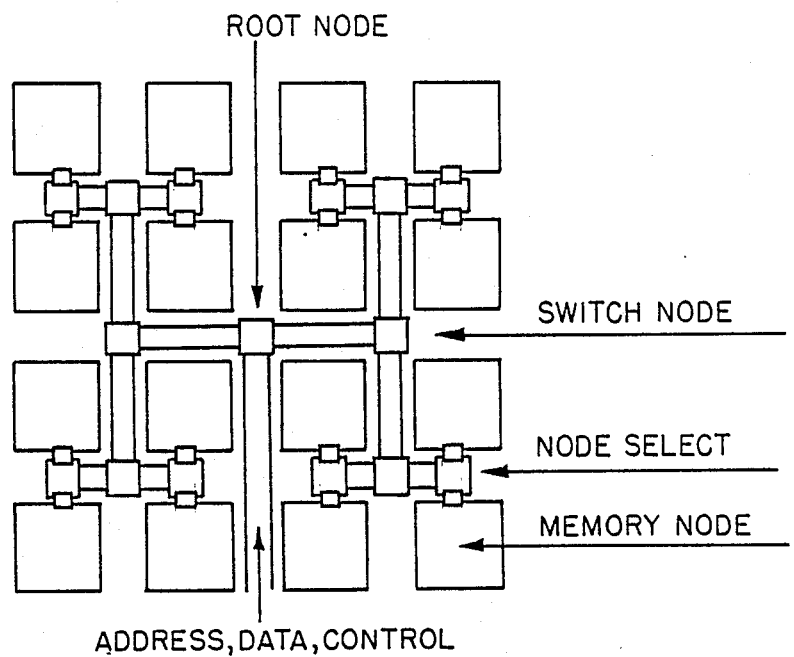
FIG. 3 is a block diagram of the fault tolerant test apparatus according to the present invention.
Figure 4A:
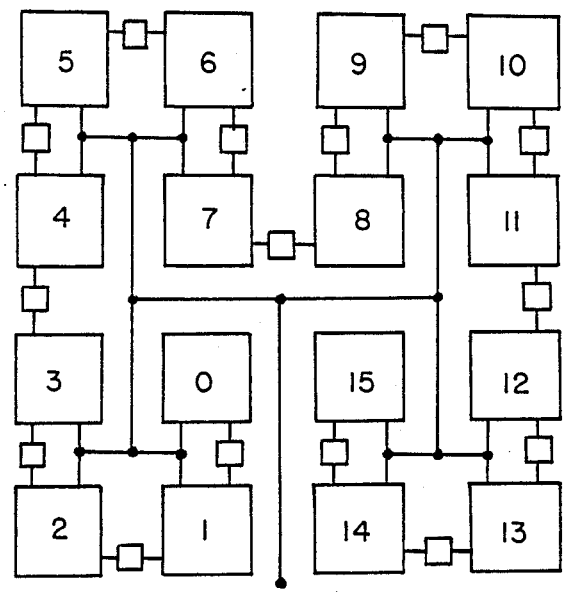
FIG. 4a is a block diagram of a RAM array partitioned into test modules.

For $r=2$, the focus of this paper, the nodes are laid out using the well known H-tree layout (11). As shown in FIG. 3, the leaf nodes or memory nodes are grouped into groups of four, forming an H - tree, which are further connected hierarchically. Each non leaf node in our architecture is a switch node which is a simple 1-out-of-2 decoder with buffers. The memory nodes are memory modules which have the traditional four quadrant organization with independent control units. The leaf nodes are numbered $B_0, B_1, \ldots, B_{Q-1}$ and consecutive numbered nodes are placed contiguously, as shown in FIG. 4a. The address/data/control bus is connected to the root node which is a switch node. The most significant address bit is decoded, generating a left subtree or a right subtree select. The other signals are buffered and propagated down the tree. This action occurs repeatedly at each level until a single memory node is selected. The remaining address bits are then used to select a cell within the node.

Let the array have $N_t$ nodes on the horizontal side and $N_s$ nodes on the vertical side. If l is odd, then let $N_t=N_s=\sqrt{Q}$, and the shape of the chip would be square. If l is even, then $N_t=\sqrt{Q/2}$ and $N_s=Q/N_t$, the chip layout having rectangular geometry. Furthermore between every pair of nodes $B_i$, $B_j$, where $j=i+1$, place a comparator $C_{i,j}$ such that $C_{i,j}$ compares the data between nodes $B_i$ and $B_j$. Let the output of each comparator be an input to a distributed NOR gate. With this structure, if all the nodes agree on a data value then output of the NOR, which is brought out as a $\overline{FAIL}$ line, takes the value '1'; else it takes the value '0'.

OPERATION

The large RAM test apparatus has two modes of operation; a Normal Mode, in which it functions as a traditional RAM with no performance penalty, and a Test Mode.

NORMAL MODE

The address, data and control buses are brought to the root node. At this point, the most significant address bit (FIG. 2) would be decoded, generating a left subtree or a right subtree select. The other signals would be buffered and propogated down the tree. This action would occur at each level within the bus until finally a single leaf node would be selected. Within the node, then, the internal timing and control unit would access the data requested, sending it up the tree or writing the value on the data bus, into the addressed location.

TEST MODE

Figure 4B:
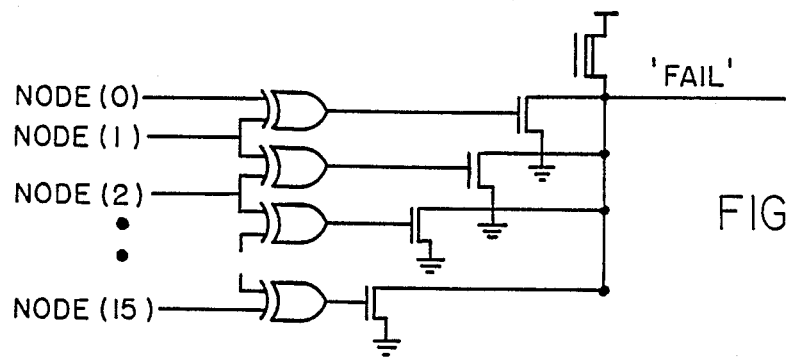
FIG. 4b is a schematic diagram of the logic test unit for the test module nodes.
Figure 4C:
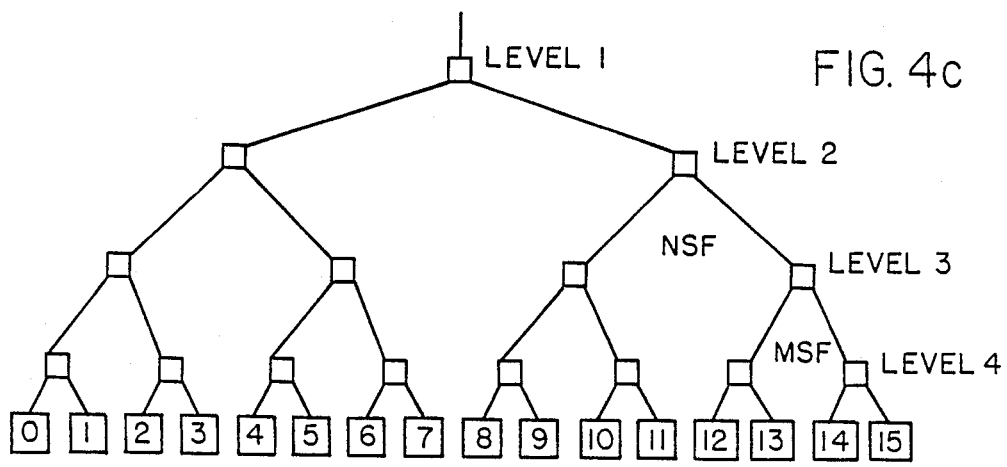
FIG. 4c is a block diagram of the various levels of test for a partitioned RAM array.

This architecture is easily testable, detailed algorithms for which are given in Appendix A. First the bus structure is tested. If it is found to be fault free, then there is no interaction between nodes; testing of each of the nodes individually is equivalent to testing the RAM as a whole. Furthermore, by using a small amount of additional hardware and the technique presented in (10) all nodes can be tested in parallel (FIG. 4c). When an additional input, test is asserted, the device enters the Test Mode. In this mode, all of the lowest level decoders are enabled, allowing the processor to address all the nodes simultaneously. Additionally, the output data buffer of each node gets modified so that during a Read, instead of being placed on the bus, the data is routed to a comparator. This enables the data output of neighboring nodes to be compared. Any disagreement between the values being compared results in a Fail signal being activated.

Thus, the testing proceeds as follows: the processor places the device in the Test Mode and, following some test algorithm, writes test patterns into the RAM. While in this mode, the full RAM looks like a single node to the processor. These test patterns would get written in all nodes in parallel. During the Read/Verify part of the algorithm, all the processor has to do is initiate a dummy read; no verification of the state of the bits is necessary. Internally, all the nodes send their data to the comparators. For example, in FIG. 4b it may be noted that nodes 0-1, 1-2 and 2-3 compare their bit values. Similarly, the other three subtrees compare their bit values. Also nodes 3-4, 7-8 and 11-12 perform comparisons. Note that all of these comparisons are occurring in parallel; therefore they would complete at the end of the Read cycle. A disagreement at any level of comparison activates the Fail signal; this can then be sent as an interrupt to the processor which realizes that one or more nodes are faulty. It can then take the RAM out of the test mode, running the test at that location in each node so as to identify each node and the faulty bit within the node. This technique is based on the fact that the probability of a particular bit in every node failing in the same way at the same time is negligible. So if all of the nodes agree on the outcome of a particular test, then they are all fault free. The reduction in testing time results from the reduction in size of the RAM array under test and from testing in parallel.

YIELD ENHANCEMENT

This test apparatus architecture supports redundancy at different levels. At the node level, spare rows and columns of memory cells, along with associated decoders, can be embedded. Faulty bits can be replaced by disconnecting the faulty row or column, the spare programmed to replace it. If the bit failure pattern makes repair imposible, or if there is a fault in the tree decoder, then the tree structure makes it easy to disconnect the faulty subtree generating half good, quarter good and other partially good products. Although many fractions may be possible (based on the size of the RAM, the number of nodes, the failure pattern) only a few would be marketable. The access times for these smaller repaired RAMs may be somewhat larger than good RAMs of the same size, however these devices are typically sold within two or three performance ranges, with lower performance devices being cheaper. Also, the upper few address bits may need to be permuted so that sequential selection of fault free nodes takes place. For large RAMs, complete spare nodes can be embedded to replace faulty nodes.

Besides the failure of the nodes and the decoders within the tree, it is also possible for the interconnect to fail. However, the reliability of the interconnect is much higher than that of the active cells (nodes and tree decoders), because of the simplicity of the bus structure. The interconnect in the MIT Lincoln Lab. project, which uses a two layer metal manhatten wiring, takes three masking steps to fabricate—compared to over a dozen steps required for active devices. In that project, yields for these wires were targeted at over 95 percent. A considerable amount of reserach is being done in restructurable VLSI using programmable interconnect; that technology can be used here in creating fault tolerant bus structures.

APPENDIX A

Test procedure for a fault RAM test apparatus. The testability technique that is used here enables Q nodes to be tested in parallel. A test algorithm with $c(N)^k$ steps now requires only $c(M)^k$ steps. Such a reduction can be used to reduce the testing time which in turn may make a more thorough testing possible because a more complex algorithm can now be used. In this section test algorithms for testing the RAM are provided. What we propose are test algorithms that test the tree decoder and the BITS. For testing the memory nodes, conventional test algorithms are used.

Let each cell be identified by the address $A_{i,j}$ where $0 \leq i \leq (N/Q)-1$ (address within node) and $0 \leq j \leq Q-1$ (Node address). The nodes are denoted by $B_j$, where $0 \leq j \leq Q-1$.

Thus testing the RAM involves three sets of tests:
1. Testing the tree decoder.
2. Testing the built in test structure (BITS).
3. Testing the memory nodes.

5.1 Testing of Tree Decoder

The classical stuck-at-fault model for the tree decoder is used. A s-a-0 fault on a subtree select line simply disconnects the subtree below it. A s-a-1 fault permanently selects the subtree below it, leading to multiple nodes being enabled. These faults can therefore lead to one of the following conditions:

No selection: (NS) Although a subtree should be selected, it is not. This condition leads to no node being enabled in the device.

Multiple selection: (MS) Two subtrees are enabled. This leads to multiple nodes being enabled.

NS faults are easy to detect, as a read in that address space returns a constant value ('0 'or '1'-implementation dependent) independent of the writes. MS faults can be modeled as a logical OR or AND (but not both) of the outputs of the two nodes [29,18]. The approach used verifies if it is possible to access any one cell uniquely in each node. If that is possible, then the tree-decoder is functional; the cell $A_{o,j}$ is used for this purpose. At this stage, though no attempt is made to test the cells within the nodes, faults in the Q cells $A_{0,0}$ to $A_{0,Q-1}$ will be detected. Major defects like a stuck-at fault on the data bus, etc., would also be detected. The algorithm below has been adapted from [29]; it assumes an OR in case of multiple faults. If the behavior is AND, its dual can be used, as explained in [29].

Algorithm 5.1 Tree Decoder Test.
Begin
(1) For $j=0$ to $Q-1$ do Write $A_{0,j}=0$
(2) For $j=0$ to $Q-1$ do
Begin
  (i) Read $A_{0,j}(0)$ (* Verify that cell has been set to '0'*)
  (ii) Write $A_{0,j}=1$
End
(3) For $j=0$ to $Q-1$ do
Read $A_{0,j}(1)$ (* Verify that cell has been set to '1'*)
End.

Lemma 5.1 Algorithm Tree Decoder Test tests the tree decoder in 4Q operations. For proof, refer to [29].

5.2 Test of Built in Test Structure (BITS)

The BITS consists of comparators (EXOR gates) driving a distributed NOR gate. Note that since a single 'Fail' line is used to indicate all failures there cannot be a stuck-at-fault on this line. (If this happens then the parallel test feature cannot be used). The algorithm that follows detects all single stuck-at faults in the BITS.

The test should verify that each comparator can, independently, pull the $\overline{Fail}$ line low, when its inputs disagree, leaving it high when its input agree. Essentially, all four inputs, 00, 01, 10, 11 have to be applied to each EXOR. The algorithm uses one cell at the same logical node address in each node. This cell is then used to feed test patterns to the EXOR gates. Note that this logical address may or may not correspond to the physical address. If the node is fault free, then they would be the same. The cells $A_{0,0}$ to $A_{0,Q-1}$ are used as the previous algorithm verifies these to be fault free. The Algorithm for this is as follows:

Algorithm 5.2 BITS Test.
Begin
(Test the EXOR gates by first applying 11, then 10, 00 and finally 01, 11 to each gate and observing the effect on the $\overline{Fail}$ line.)
(1) For $j=0$ to $Q-1$ do
Write $A_{0,j}=1$. Put device in test mode and perform a dummy read at address '0'. Verify that $\overline{Fail}$ remains high.
(2) For $k=0$ to 1 do
Begin
For $j=0$ to $Q-1$ do
Begin
  (i) Put chip in Normal Mode
  (ii) Write $A_{0,j}=k$
  (iii) Put chip in Test Mode
  (iv) Perform dummy read at address '0'
  (v) Verify: If $j=Q-1$ then $\overline{Fail}$ line is high else it is low.
End
End
End.

The cell in each node is used to set test inputs to the EXOR gates. The algorithm essentially applies the test patterns shown in Table 1 to the combinational circuit represented by the $Q-1$ EXOR gates and the NOR gate. Initially, in step (1) all the inputs to the EXOR are set to '1' (Q operations). The RAM is put in test mode dummy read is performed at address 0, and checked if the $\overline{Fail}$ line is high (three operations). Steps 2.i to 2.v, in the first pass (k=0), ripple a '0' through the inputs of the EXOR and a '1' in the second pass (k=1). Initially, each EXOR has '1' its input. During the first pass, Steps 2.i to 2.v, each EXOR gets exercised through 0,1 and 0,0; by the second pass, through 1,0 and once again 1,1. Thus, each EXOR is individually tested exhaustively. The $Q-1$ input NOR gate also gets all the Q test vectors to test it completely. Each time a test is applied to the EXOR, its effect on the Fail line is observed. It can therefore be seen that unequal inputs correctly trigger the $\overline{Fail}$ line. This operation requires 10Q steps.

Therefore, the total steps are: $11Q+3$. □

Lemma 5.2 Algorithm BITS Test tests the built in test structure with typically $15Q+3-$operations.

TABLE 1

| Test vectors applied to the BITS circuit | | | | | |
|---|---|---|---|---|---|
| $A_{i,0}$ | $A_{i,1}$ | $A_{i,2}$ | $A_{i,3}$ | ... | $A_{i,Q-1}$ |
| 1 | 1 | 1 | 1 | ... | 1 |
| 0 | 1 | 1 | 1 | ... | 1 |
| 0 | 0 | 1 | 1 | ... | 1 |
| 0 | 0 | 0 | 1 | ... | 1 |
| 0 | 0 | 0 | 0 | ... | 1 |
| 0 | 0 | 0 | 0 | ... | 0 |
| 1 | 0 | 0 | 0 | ... | 0 |
| 1 | 1 | 0 | 0 | ... | 0 |
| 1 | 1 | 1 | 0 | ... | 0 |
| 1 | 1 | 1 | 1 | ... | 0 |
| 1 | 1 | 1 | 1 | ... | 1 |

5.3 Test of Memory Node

Once the functionality of the tree decoder and the BITS is verified, the device can be put in test mode and the nodes then tested in parallel. At this stage, it simply looks like a RAM of size M instead of N. The processor has only to write test vectors and then during Read and Verify, initiate a dummy Read. It can of course read the state of the $\overline{Fail}$ line and verify it is '1'. A better solution, though, would be to use it as an interrupt. Several algorithms are available to test RAM's [18, 15, 31, 40]. For completeness, the use of the Algorithm presented in [31] is recommended because of its good fault coverage and low complexity; $\theta(N \log N)$. In practice, every manufacturer has his own algorithm which would test defects specific to his production line. In general, any test algorithm can be applied to the proposed device; on detection of a defect(fault), the tester can remove the device out of 'Test Mode' and interrogate each node to locate the faulty one, making fault location simple. It is important to note here that only the last test pattern needs to be repeated at each node, not the full test.

Theorem 5.1 The RAM proposed can be tested in typically $(19Q+3+36M+24M \log M)$ operations, using the algorithm presented in [31]. Proof follows directly from Lemmas 5.1 and 5.2 and from the above discussion.
□

Figure 5:
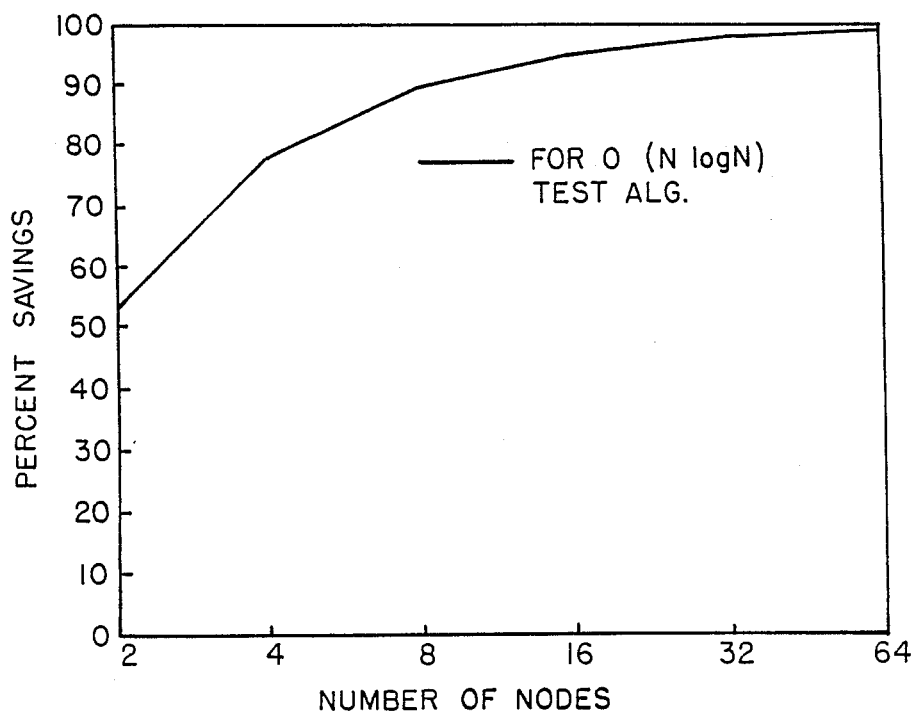
FIG. 5 is a graphical representation of the time savings versus the number of nodes in the RAM.

Use of this architecture results in significant saving in testing time. FIG. 5 shows the time that would be saved if this architecture was used. The algorithm used here is the one in [31]. It may be noted that the reduction in testing time increases as Q increases and also as the complexity of the test algorithm increases; this makes it feasable to apply more thorough tests to larger RAMs. As the product matures, this saving can be increasingly significant. Furthermore, testing costs become critical as the production volume increases. Also with fewer defects, the additional time spent in removing the RAM from the test mode, and interrogating it in diagnosis mode is reduced. In summary, this architecture makes testing of very large RAMs practical.

Although the invention has been described with reference to a particular embodiment, it will be undestood to those skilled in the art that the invention is capable of a variety of alternative embodiments within the spirit and scope of the appended claims.

What is claimed is:

1. A tree random access memory test apparatus comprising in combination:

a random access memory of size $N=2^n$ is divided into a plurality of modules, where N is the size of the random access memory in bits and n is the number of address lines, each module of said plurality of modules comprises four memory nodes which are arranged in a four quadrant configuration, a plurality of first switch nodes, each first switch node of said plurality of first switch nodes is respectively connected to a pair of memory nodes, a plurality of second switch nodes, each second switch node of said plurality of second switch nodes is respectively connected to a pair of first switch nodes, and a plurality of third switch nodes, each third switch node of said plurality of third switch nodes is respectively connected to a pair of second switch nodes, said third switch node receiving address, data and control signals, said random access memory when in the test mode receiving a test signal which is read into the memory nodes in parallel, each pair of memory nodes being connected to a comparator, during the test mode said plurality of memory nodes send their respective test signal to their respective comparator which compares test signals and provides a fail signal in a disagreement in test signal comparison.

2. A tree random access memory test apparatus as described in claim 1 wherein said first switch node comprises a memory node select switch.

3. A tree random access memory test apparatus as described in claim 1 wherein said second switch node comprises a subtree select switch with buffers.

4. A tree random access memory test apparatus as described in claim 1 wherein said third switch node comprises a root node select switch.

5. A tree random access memory test apparatus as described in claim 1 wherein said first, second and third switch nodes comprise 1 out of 2 decoder units.

6. A tree random access memory test apparatus as described in claim 1 wherein a fail signal indicates a failed memory node which may be disabled.

* * * * *